(12) United States Patent
Koo et al.

(10) Patent No.: US 7,532,184 B2
(45) Date of Patent: May 12, 2009

(54) FLAT PANEL DISPLAY WITH IMPROVED WHITE BALANCE

(75) Inventors: Jae-Bon Koo, Yongin (KR); Sang-Il Park, Seoul (KR); Ul-Ho Lee, Yongin (KR); Jin-Soo Kim, Yongin (KR); Jin-Woung Jung, Suwon (KR); Chang-Gyu Lee, Seoul (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 788 days.

(21) Appl. No.: 10/813,391

(22) Filed: Mar. 31, 2004

(65) Prior Publication Data

US 2004/0207582 A1     Oct. 21, 2004

(30) Foreign Application Priority Data

Apr. 17, 2003  (KR) .................. 10-2003-0024428
Apr. 17, 2003  (KR) .................. 10-2003-0024505

(51) Int. Cl.
*G09G 3/32*     (2006.01)
*G09G 3/36*     (2006.01)

(52) U.S. Cl. .................. 345/88; 257/330; 257/331; 345/695

(58) Field of Classification Search .............. 315/169.1, 315/169.3, 169.4; 345/82, 695, 696, 87, 345/88; 257/59, 72, 330, 331; 349/41, 42
See application file for complete search history.

(56) References Cited

U.S. PATENT DOCUMENTS

| | | | | |
|---|---|---|---|---|
| 5,001,540 A * | 3/1991 | Ishihara | .................. | 257/329 |
| 5,574,294 A * | 11/1996 | Shepard | .................. | 257/66 |
| 6,107,660 A * | 8/2000 | Yang et al. | .................. | 257/329 |
| 6,222,205 B1 * | 4/2001 | Geng et al. | .................. | 257/96 |
| 6,278,130 B1 * | 8/2001 | Joo et al. | .................. | 257/59 |
| 6,366,025 B1 * | 4/2002 | Yamada | .................. | 315/169.3 |
| 6,404,030 B1 * | 6/2002 | Ma et al. | .................. | 257/459 |
| 6,529,213 B1 * | 3/2003 | Kimura | .................. | 345/696 |

(Continued)

FOREIGN PATENT DOCUMENTS

CN      1305227      7/2001

(Continued)

*Primary Examiner*—Amare Mengistu
*Assistant Examiner*—Jennifer Zubajlo
(74) *Attorney, Agent, or Firm*—H.C. Park & Associates, PLC

(57) ABSTRACT

The present invention discloses a flat panel display capable of improving a white balance by using offset lengths or doping concentrations of offset regions between multi gates of driving transistors in R, G, and B unit pixels. The flat panel display comprises a plurality of pixels, where each of the pixels includes R, G and B unit pixels to embody red (R), green (G) and blue (B) colors, respectively, and each of the unit pixels including a transistor with multi gates. Transistors of at least two unit pixels of the R, G, and B unit pixels have offset regions with different geometric structures between the multi gates from one another. An offset region of a transistor for driving a light-emitting device having the highest luminous efficiency among the transistors of the R, G, and B unit pixels, is formed to have a longer offset length or a lower doping concentration, than those of offset regions of transistors for driving light-emitting devices having relative lower luminous efficiency.

16 Claims, 10 Drawing Sheets

U.S. PATENT DOCUMENTS

| | | | |
|---|---|---|---|
| 6,670,230 B2 * | 12/2003 | Hsieh | 438/206 |
| 6,750,487 B2 * | 6/2004 | Fried et al. | 257/270 |
| 7,053,890 B2 * | 5/2006 | Inukai | 345/211 |
| 7,163,848 B2 * | 1/2007 | Yamazaki et al. | 438/149 |
| 2001/0038098 A1 | 11/2001 | Yamazaki et al. | |

FOREIGN PATENT DOCUMENTS

| | | |
|---|---|---|
| JP | 2001-109399 | 4/2001 |
| JP | 2001-290441 | 10/2001 |

* cited by examiner

FLAT PANEL DISPLAY WITH IMPROVED WHITE BALANCE

CROSS-REFERENCE TO RELATED APPLICATION

This application claims the benefits of Korean Patent Applications No. 2003-24428 and 2003-24505, filed on Apr. 17, 2003, the disclosures of which are hereby incorporated herein by reference in its entirety.

FIELD OF THE INVENTION

The present invention relates to a full-color flat panel display and, more particularly, to a flat panel display capable of embodying a white balance by adjusting a doping concentration or an offset length of an offset region between multi gates.

BACKGROUND OF THE INVENTION

Generally, an organic light emitting diode (OLED) being a flat panel display includes a plurality of pixels 100 arranged in the form of matrix as shown in FIG. 1, and each of the pixels consists of three unit pixels of an unit pixel 110R to embody a red color (R), an unit pixel 120G to embody a green color (G), and an unit pixel 130B to embody a blue color (B).

The R unit pixel 110R includes a red electroluminescence (EL) device 115 including a red (R) light emitting layer, a driving transistor 113 for supplying a current to the red EL device 115, and a switching transistor 111 for switching the current supply from the driving transistor 113 to the red EL device 115.

The G unit pixel 120G includes a green EL device 125 including a green (G) light emitting layer, a driving transistor 123 for supplying a current to the green EL device 125, and a switching transistor 121 for switching the current supply from the driving transistor 123 to the green EL device 125.

The B unit pixel 130B includes a blue EL device 135 including a blue (B) light emitting layer, a driving transistor 133 for supplying a current to the blue EL device 135, and a switching transistor 131 for switching the current supply from the driving transistor 133 to the blue EL device 135.

Conventionally, the driving transistors 113, 123 and 133 of the R, G and B unit pixels 110R, 120G and 130B of an OLED have the same size, that is, the ratio W/L of the width W to the length L of the channel layer is the same. The order of the EL devices in the order of their luminous efficiency is B, R and G unit pixels. Since the sizes of the driving transistors 113, 123 and 133 of the R, G, and B unit pixels 110R, 120G and 130B are same while luminous efficiencies of each R, G and B EL layer 115, 125 and 135 are different from one another, it was difficult to embody the white balance.

In order to embody the white balance, a relatively small quantity of current should be supplied to the EL device having high luminous efficiency, for example, the green EL device, and a relatively large quantity of current should be supplied to the red and blue EL devices having a lower luminous efficiency.

Here, since a current Id flowing to the EL device through the driving transistor begins to flow when the driving transistor is in the saturation state, the current is expressed as follows.

$$Id = Cox\, \mu W(Vg-Vth)^2/2L \quad (1)$$

Therefore, one of the methods for controlling the current flowing to the EL device in order to embody the white balance is to make the sizes of the driving transistors of the R, G and B unit pixels, that is, the ratio W/L of the width W to the length L of the channel layer, different and then to control the quantity of the current flowing to the EL devices of the R, G and B unit pixels. A method for controlling the quantity of current flowing to the EL device in accordance with the size of the transistor is disclosed in the Japanese Laid-open Publication No. 2001-109399. In this Japanese patent, the sizes of the driving transistors of the R, G and B unit pixels are formed differently in accordance with the luminous efficiency of the EL device in each R, G and B unit pixel. That is, the quantity of the current flowing to the EL device of the R, G and B unit pixels is controlled by making the size of the driving transistor of the unit pixel to embody the green (G) having a high luminous efficiency smaller than the size of the driving transistors of the unit pixels to embody the red (R) or blue (B) having a relatively low luminous efficiencies.

Another method to embody the white balance is to make the dimensions of the light emitting layers of R, G and B unit pixels different, which is disclosed in the Japanese Laid-open Patent Publication No. 2001-290441. In this Japanese patent, the same luminance is generated from the R, G and B unit pixels by making the light emitting areas different in accordance with the light emitting efficiencies of the EL devices of the R, G and B unit pixels. That is, the same luminance is generated from the R, G and B unit pixels by making light emitting areas of the R unit pixel or B unit pixel having lower luminous efficiencies larger than that of the G unit pixel having high luminous efficiency relatively.

However, in the conventional method for embodying the white balance described above, the light emitting area of the unit pixel having low luminous efficiency among the R, G and B unit pixels is enlarged, or the size of the transistor of the unit pixel having low luminous efficiency among the R, G and B unit pixels is increased. Therefore, the area occupied in each pixel is increased, and it is not easy to apply the method to a high definition display.

SUMMARY OF THE INVENTION

It is, therefore, an aspect of the present invention to provide a flat panel display capable of embodying a white balance without increasing the area of a pixel.

Another aspect of the present invention provides a flat panel display capable of embodying a white balance by making different geometric structures of offset regions between multi gates of driving transistors in each R, G, and B unit pixel, thereby changing resistance values of the drain regions.

It is a further aspect of the present invention to provide a flat panel display capable of embodying a white balance by making offset lengths of offset regions between multi gates of driving transistors in each R, G, and B unit pixel.

To achieve these and other purposes, an exemplary embodiment of the present invention provides a flat panel display, which comprises a plurality of pixels, where each of the pixels includes R, G and B unit pixels to embody red (R), green (G) and blue (B) colors, respectively. Each of the unit pixels includes a transistor with multi gates, wherein transistors of at least two unit pixels of the R, G, and B unit pixels include offset regions with different geometric structures between the multi gates from one another.

The R, G, and B unit pixels further include light-emitting devices driven by the transistors, respectively. A resistance value of an offset region of a transistor for driving a light-emitting device having the highest luminous efficiency among the transistors of the R, G, and B unit pixels is higher than those of offset regions of transistors for driving light-emitting devices having relatively low luminous efficiency.

Total lengths of the offset regions between the multi gates of the transistors of the R, G, and B unit pixels are same, and offset lengths of portions in the offset regions, which are not doped with impurities, are different with one another. The R, G, and B unit pixels further include light-emitting devices driven by the transistors, respectively. An offset length of an offset region of a transistor for driving a light-emitting device having the highest luminous efficiency among the transistors is longer than those of transistors for driving light-emitting devices having relative low luminous efficiency.

Total lengths of the offset regions between the multi gates of the transistors of the R, G, and B unit pixels are same, and the offset regions have different widths from one another. Alternatively, widths of the offset regions between the multi gates of the transistors of the R, G, and B unit pixels are same, and the lengths of the offset regions are different with one another.

An additional exemplary embodiment of the present invention provides a flat panel display, which comprises a plurality of pixels, where each of the pixels includes R, G and B unit pixels to embody red (R), green (G) and blue (B) colors, respectively. Each of unit pixels includes a transistor with multi gates, wherein transistors of at least two unit pixels of the R, G, and B unit pixels include offset regions having different resistance values between the multi gates from one another.

The unit pixels having different resistance values from one another include light-emitting devices, respectively, and the transistors for controlling currents supplied to the light-emitting devices of each unit pixel have channel layers with the same size. The R, G, and B unit pixels further include light-emitting devices driven by the transistors, respectively, Resistance values of the offset regions of the transistors are determined by the luminous efficiencies of the light-emitting devices driven by the transistors.

A resistance value of an offset region of a transistor for driving a light-emitting device having the highest luminous efficiency among the transistors of the R, G, and B unit pixels is higher than those of transistors for driving light-emitting devices having relatively low luminous efficiency.

The offset regions of the transistors of the R, G, and B unit pixels have different doping concentrations from one another. The R, G, and B unit pixels further include light-emitting devices driven by the transistors, respectively, where an offset region of a transistor for driving a light emitting device having the highest luminous efficiency among the transistors is doped with an impurity concentration lower than the offset regions of transistors for driving light-emitting devices having relatively low luminous efficiency.

The offset regions of at least two transistors among the transistors of the R, G, and B unit pixels are doped with impurities having different doping concentrations from one another. The R, G, and B unit pixels further include light-emitting devices driven by the transistors, respectively, where an offset region of a transistor for driving a light-emitting device having the highest luminous efficiency of the at least two transistors is doped with impurities at a doping concentration lower than that of the other transistor.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
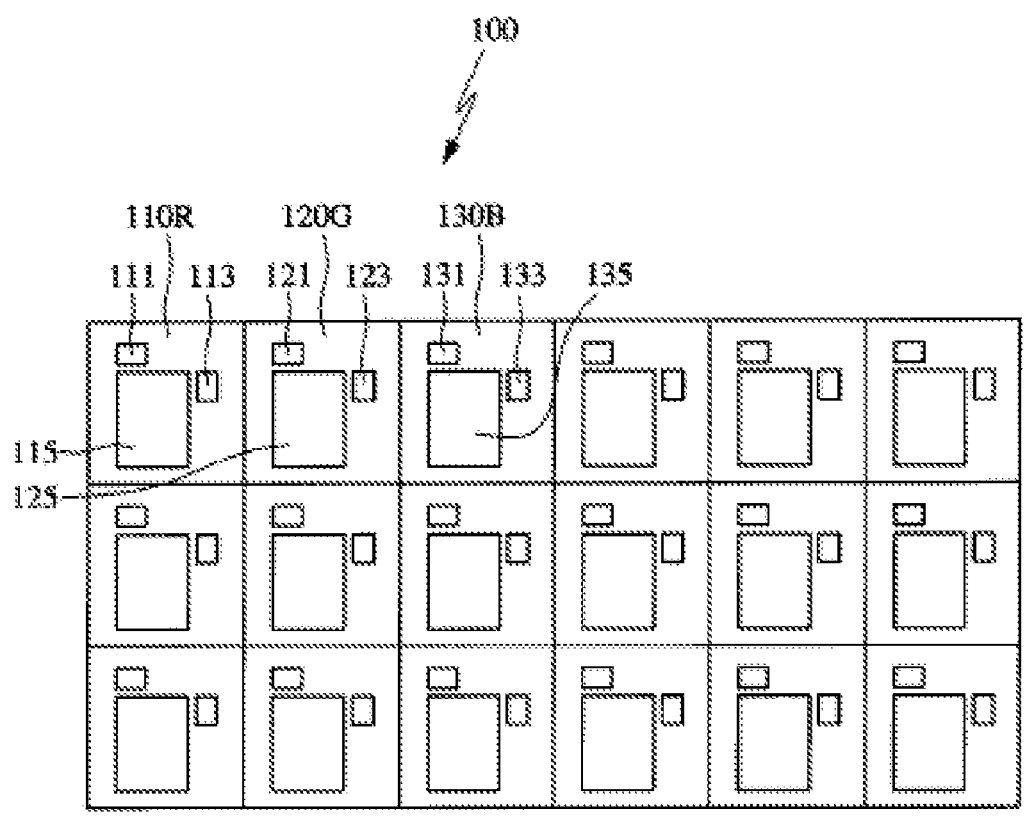
FIG. 1 is a view showing an arrangement of R, G, and B unit pixels in a conventional flat panel display.

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout the specification.

Figure 2A:
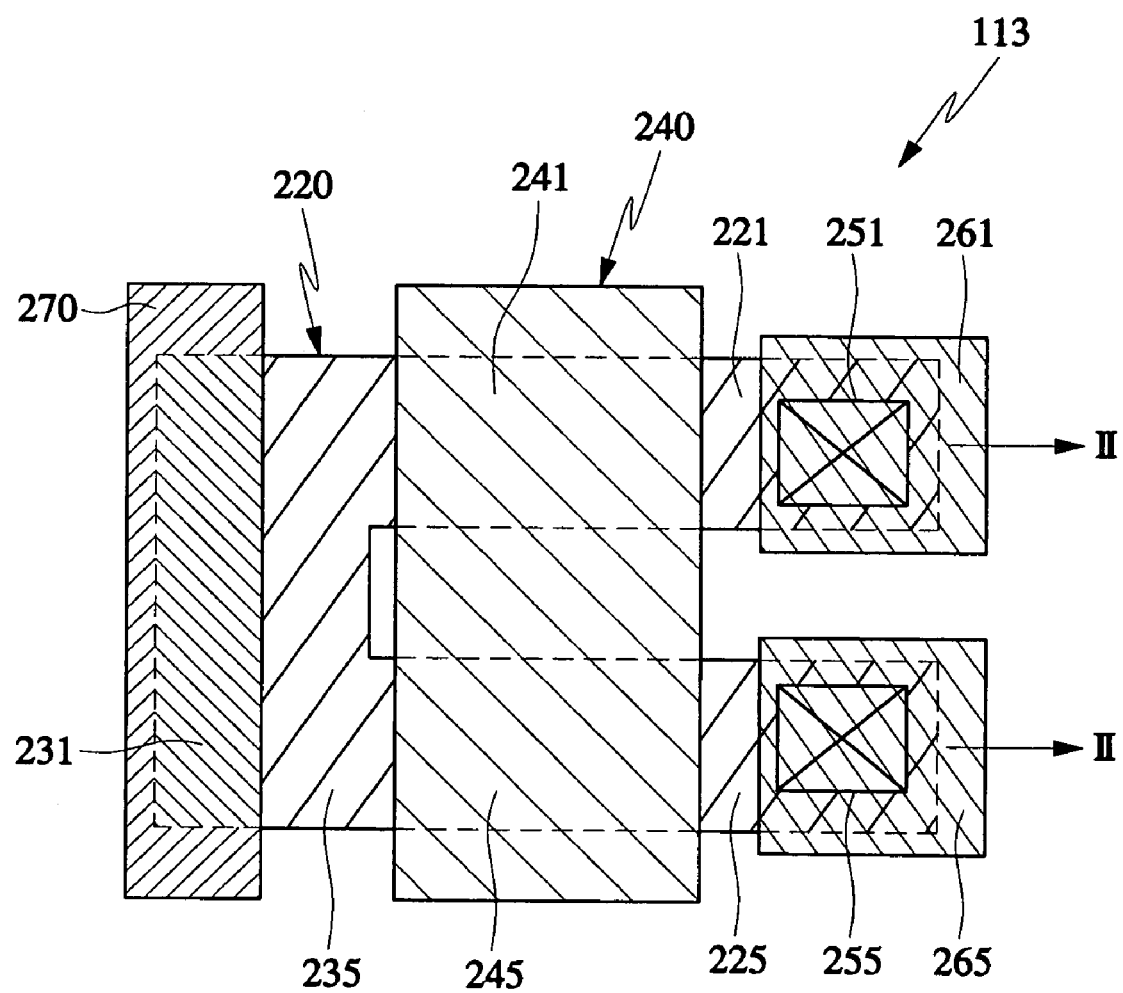
FIGS. 2a and 2b are views showing a plane structure and a cross-sectional structure of a driving transistor of an R unit pixel in a flat panel display in accordance with an embodiment of the present invention, respectively.
Figure 2B:
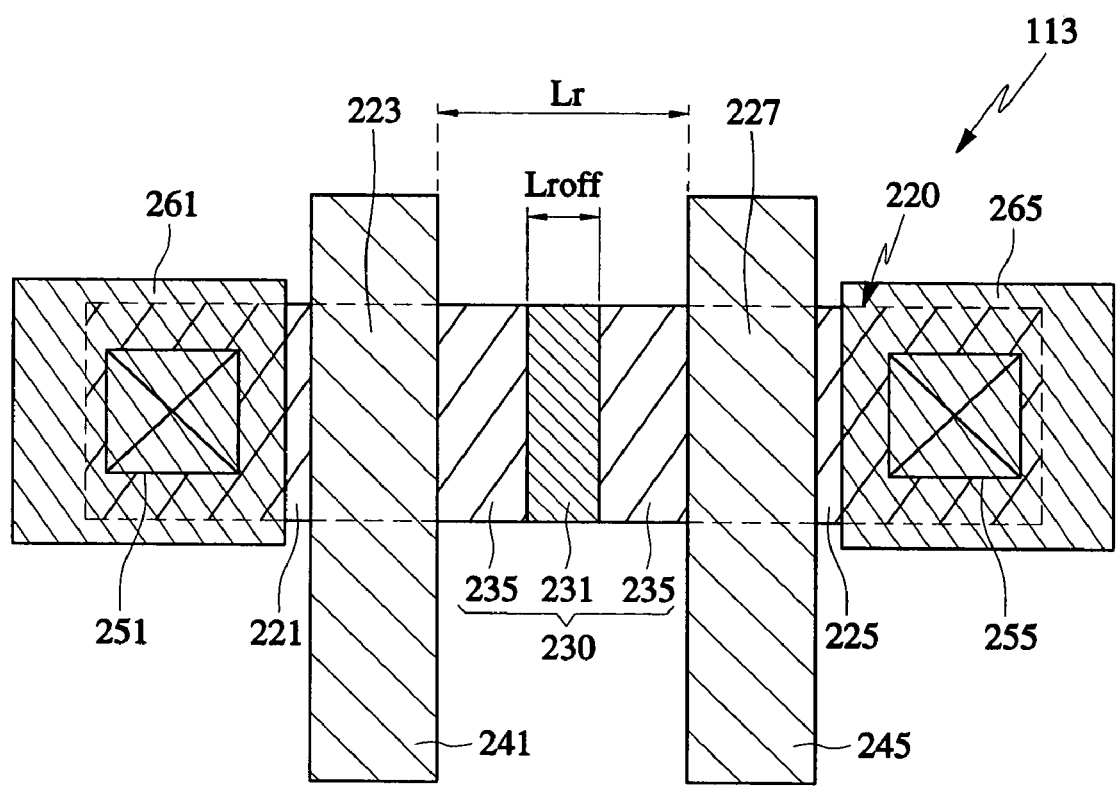

FIG. 2a shows a plane structure of a driving transistor of an R unit pixel in an OLED in accordance with an embodiment of the present invention, and FIG. 2b shows a cross-sectional structure of the driving transistor of the R unit pixel, which is taken along the line II-II of FIG. 2a.

Referring to FIGS. 2a and 2b, a driving transistor 113 of an R unit pixel includes a semiconductor layer 220, a gate electrode 240, and source/drain electrodes 261 and 265. The gate electrode 240 includes multi gates 241 and 245 corresponding to the semiconductor layer 220. The semiconductor layer 220 includes multi channel layers 223 and 227 formed at portions corresponding to the multi gates 241 and 245, and source/drain regions 221 and 225 formed at the sides of the multi channel layers 223 and 227. The source/drain regions 221 and 225 are electrically connected to the source/drain electrodes 261 and 265 through contacts 251 and 255, respectively.

In addition, the semiconductor layer 220 further includes an offset region 230 between the multi gates 241 and 245, i.e., between the multi channel layers 223 and 227. The offset region 230 includes a portion 235 doped with a high concentration of impurities having the same conductivity type as the source/drain regions 221 and 225, and an offset portion 231 not doped with impurities, wherein $L_{roff}$ is the length of the offset portion 231 among the length $L_r$ of the offset region 230.

In FIG. 2a, a numerical reference 270 indicates a mask used for defining the offset length $L_{roff}$ in the offset region 230 between the multi gates 241 and 245. In other words, the mask 270 is used as a mask for ion implanting of impurities into the portion 235 of the offset region 230, and the offset length $L_{roff}$ is determined in accordance with an overlapping degree between the mask 270 and the offset region 230.

Figure 3A:
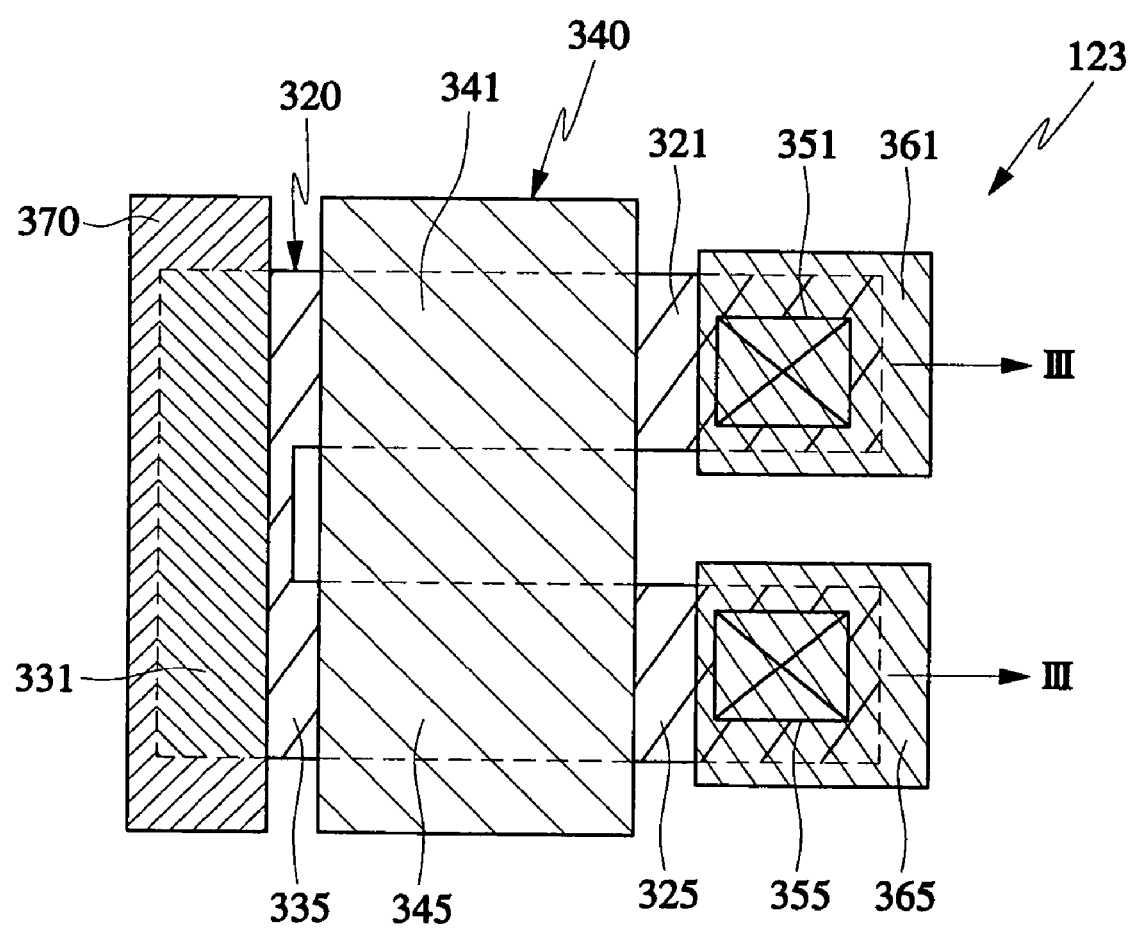
FIGS. 3a and 3b are views showing a plane structure and a cross-sectional structure of a driving transistor of a G unit pixel in a flat panel display in accordance with an embodiment of the present invention, respectively.
Figure 3B:
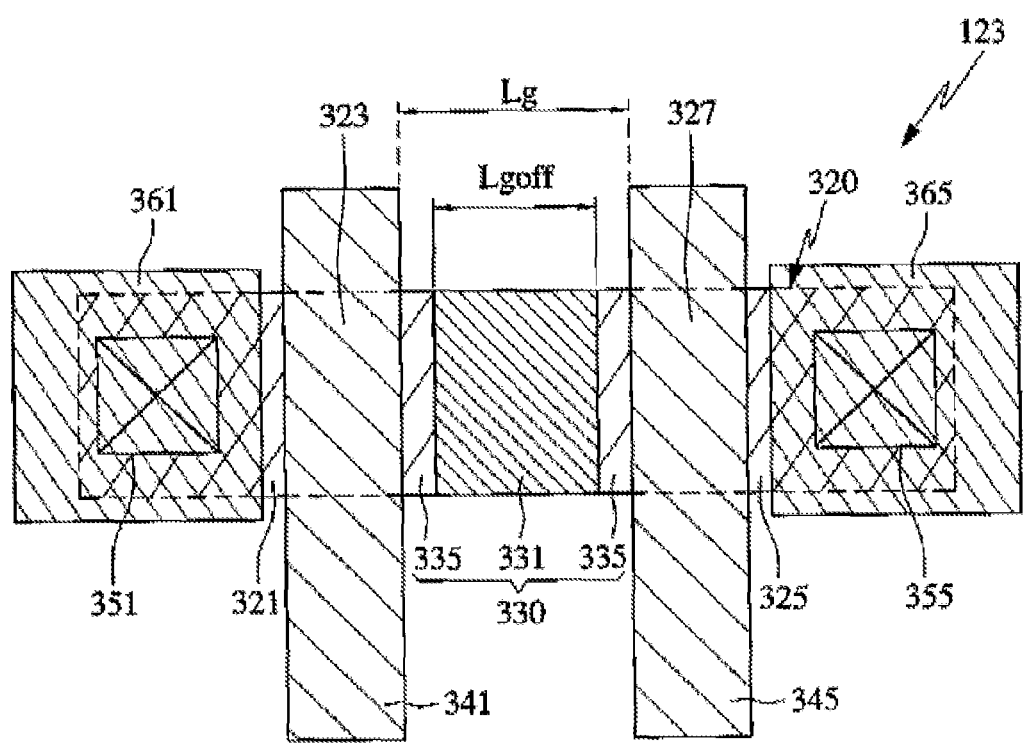

FIG. 3a shows a plane structure of a driving transistor of a G unit pixel in an OLED in accordance with an embodiment of the present invention, and FIG. 3b shows a cross-sectional structure of the driving transistor of the G unit pixel, which is taken along the line III-III of FIG. 3a.

Referring to FIGS. 3a and 3b, a driving transistor 123 of a G unit pixel includes a semiconductor layer 320, a gate electrode 340, and source/drain electrodes 361 and 365. The gate electrode 340 includes multi gates 341 and 345 corresponding to the semiconductor layer 320. The semiconductor layer 320 includes multi channel layers 323 and 327 formed at portions corresponding to the multi gates 341 and 345, and source/drain regions 321 and 325 formed at the sides of the multi channel layers 323 and 327. The source/drain regions 321 and 325 are electrically connected to the source/drain electrodes 361 and 365 through contacts 351 and 355, respectively.

In addition, the semiconductor layer 320 further includes an offset region 330 between the multi gates 341 and 345, i.e., between the multi channel layers 323 and 327. The offset region 330 includes a portion 335 with high concentration impurities having the same conductivity type as the source/drain regions 321 and 325, and an offset portion 331 not doped with impurities, wherein $L_{goff}$ is the length of the offset portion 331 among the length $L_g$ of the offset region 330.

In FIG. 3a, a numerical reference 370 indicates a mask used for defining the offset length $L_{goff}$ in the offset region 330 between the multi gates 341 and 345. In other words, the mask 370 is used as a mask for ion implanting of impurities into the portion 335 of the offset region 330, and the offset length $L_{goff}$ is determined in accordance with an overlapping degree between the mask 370 and the offset region 330.

In the driving transistor of the G unit pixel having the highest luminous efficiency among the R, G, and B unit pixels, the offset length $L_{goff}$ in the offset region 330 between the multi gates 341 and 345 is made longer than the offset length $L_{roff}$ in the offset region 230 between the multi gates 241 and 245 of the driving transistor of the R unit pixel having low luminous efficiency.

Figure 4A:
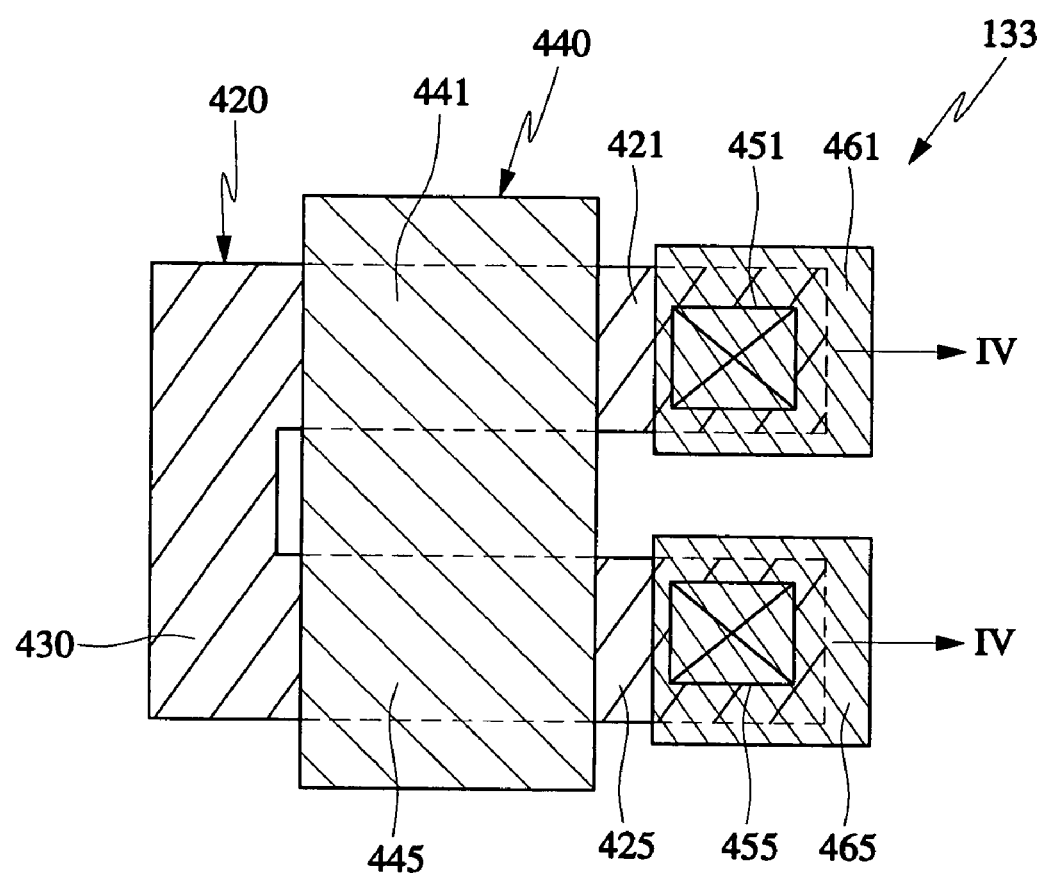
FIGS. 4a and 4b are views showing a plane structure and a cross-sectional structure of a driving transistor of a B unit pixel in a flat panel display in accordance with an embodiment of the present invention, respectively.
Figure 4B:
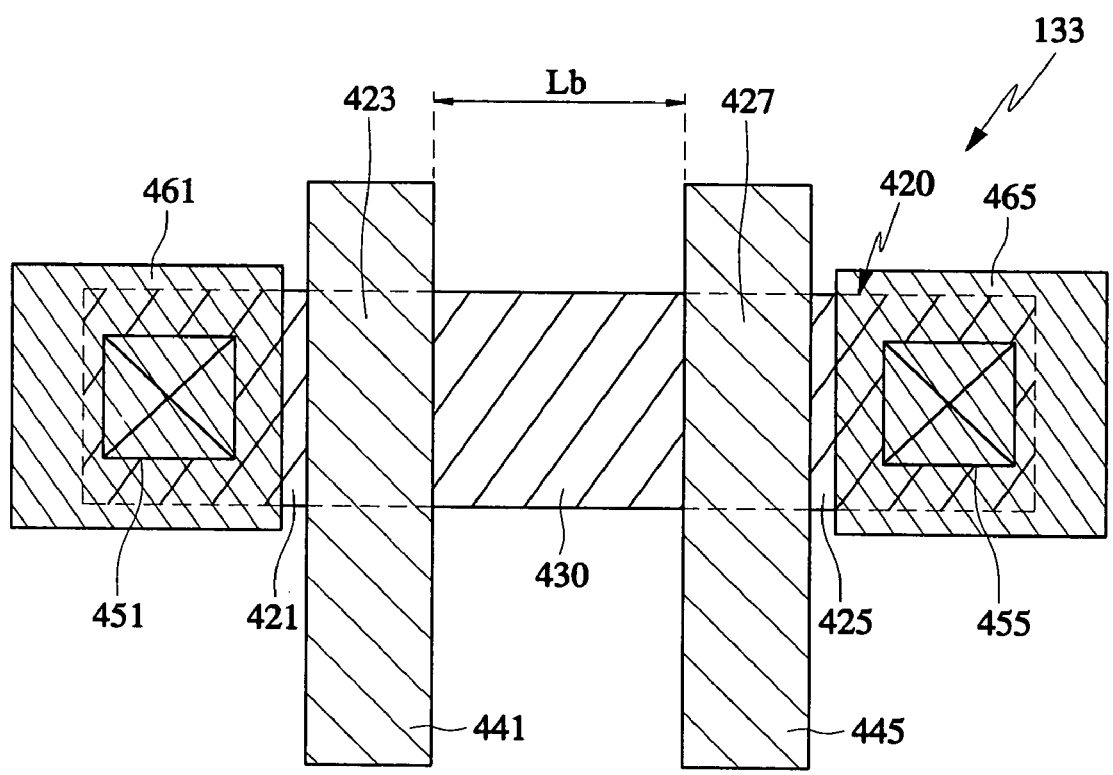

FIG. 4a shows a plane structure of a driving transistor of a B unit pixel in an OLED in accordance with an embodiment of the present invention, and FIG. 4b shows a cross-sectional structure of the driving transistor of the B unit pixel, which is taken along the line IV-IV of FIG. 4a.

Referring to FIGS. 4a and 4b, a driving transistor 133 of a B unit pixel includes a semiconductor layer 420, a gate electrode 440, and source/drain electrodes 461 and 465. The gate electrode 440 includes multi gates 441 and 445 corresponding to the semiconductor layer 420. The semiconductor layer 420 includes multi channel layers 423 and 427 formed at portions corresponding to the multi gates 441 and 445, and source/drain regions 421 and 425 formed at the sides of the multi channel layers 423 and 427. The source/drain regions 421 and 425 are electrically connected to the source/drain electrodes 461 and 465 through contacts 451 and 455, respectively.

In addition, the semiconductor layer 420 further includes an offset region 430 between the multi gates 441 and 445, i.e., between the multi channel layers 423 and 427. The offset region 430, not like the case of the R or G unit pixel, is entirely doped with high concentration impurities having the same conductivity type as the source/drain regions 421 and 425. And the length $L_{boff}$ of the offset portion among the length $L_b$ of the offset region 430 is zero.

As mentioned above, in the driving transistor of the G unit pixel having the highest luminous efficiency among the R, G, and B unit pixels the offset length $L_{goff}$ in the offset region 330 between the multi gates 341 and 345, is made longer than the offset length $L_{roff}$ in the offset region 230 between the multi gates 241 and 245 of the driving transistor of the R unit pixel having relatively low luminous efficiency, and the offset region 430 between the multi gates 241 and 245 of the driving transistor of the B unit pixel having the lowest luminous efficiency is entirely doped with impurities to make the length $L_{boff}$ zero, so that resistance values of the offset regions between the multi gates of the R, G, and B unit pixels are made different from one another, thereby embodying the white balance.

According to an embodiment of the present invention, offset regions between multi gates of each driving transistor of R, G, and B unit pixels may be formed to have different structures from one another, so that resistance values of the offset regions are adjusted, thereby embodying the white balance.

In other words, lengths $L_r$, $L_g$ and $L_b$ of offset regions between multi gates of R, G, and B unit pixels each having different luminous efficiency from one another are formed to be the same, and lengths $L_{roff}$, $L_{goff}$ and $L_{boff}$ of the offset portions not doped with impurities in the offset regions 230, 330 and 430 are formed to be different from one another, so that resistance values of the offset regions between the multi gates of the R, G, and B unit pixels are made different with one another, thereby embodying the white balance.

That is, the G unit pixel having the highest luminous efficiency may be formed to have the highest resistance value by making the offset length longest in the offset region 330. Meanwhile, the B unit pixel having the lowest luminous efficiency may be formed to have the lowest resistance value by entirely doping the offset region 430 and making the offset length in the offset region 430 zero. The offset region 230 of the R unit pixel having the luminous efficiency between those of the G unit pixel and the B unit pixel may be formed to have the offset length $L_{roff}$ shorter than the offset length $L_{goff}$ of the offset region 330 of the G unit pixel, so that the R unit pixel has a resistance value between those of the G unit pixel and the B unit pixel.

Although the multi gates include two gates in various embodiments of the present invention, it is also possible to have a structure that has different resistance values of R, G, and B unit pixels from one another by making offset regions between multi gates of driving transistors of the R, G, and B unit pixels have different geometric structures from one another regardless of the number of gates and structures of the multi gates.

According to another embodiment of the present invention, by adjusting sizes (W/L) of offset regions between the multi gates of R, G, and B unit pixels and changing resistance values in the offset regions, the white balance can be achieved. For example, by making the total length of the offset regions between the multi gates of the R, G, and B unit pixels constant and forming the offset regions to have different widths from one another, the offset regions of the R, G, and B unit pixels can be formed to have different resistance values from one another. In addition, by making widths of the offset regions between the multi gates of the R, G, and B unit pixels have the same value and adjusting the total lengths of the offset regions to be different, the offset regions of the R, G, and B unit pixels can be also formed to have different resistance values from one another.

Furthermore, according to another embodiment of the present invention, by adjusting sizes of the offset regions between the multi gates of the R, G, and B unit pixels while adjusting lengths of offset portions not doped with impurities in the offset regions of the R, G, and B unit pixels at the same time, resistance values of the offset regions between the multi gates are adjusted, so that the white balance can be embodied.

Figure 5:
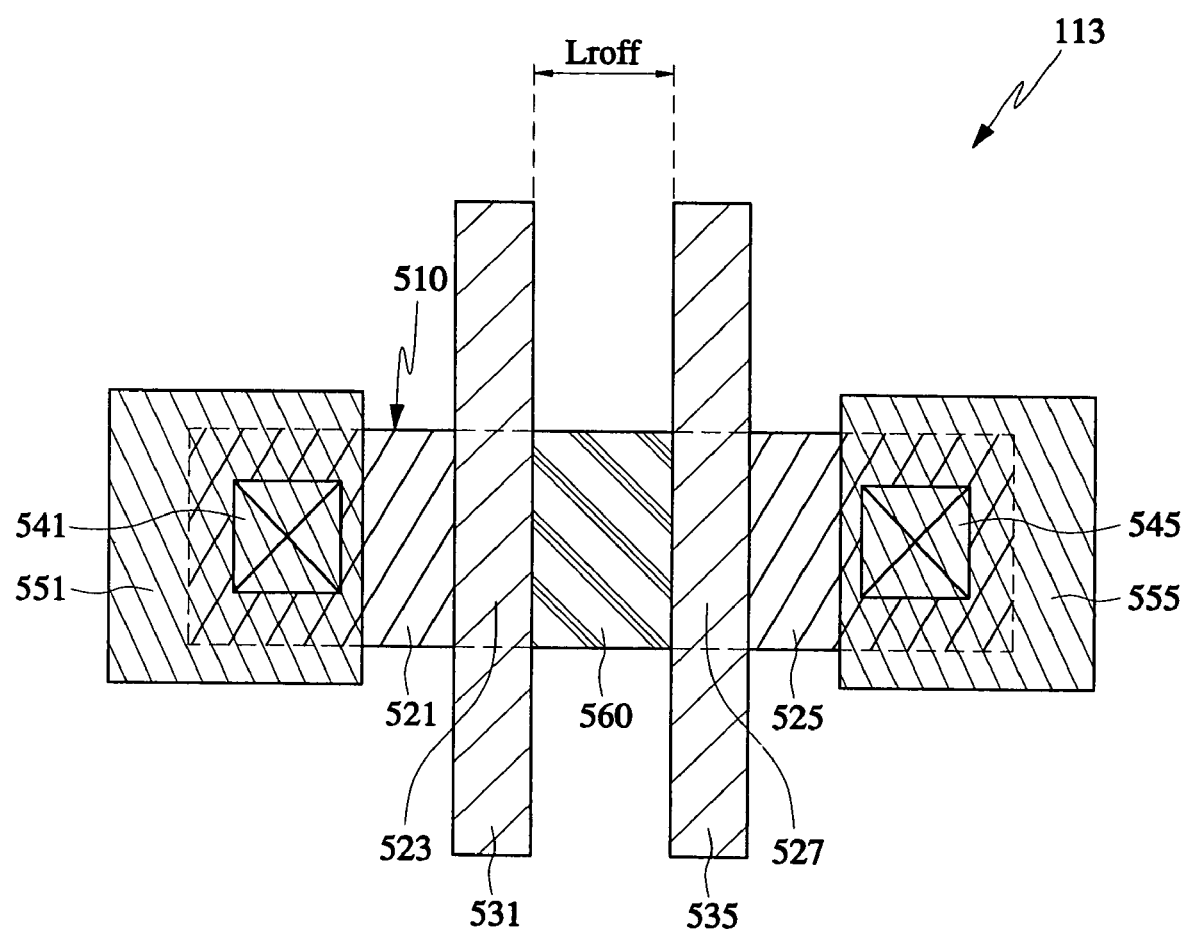
FIGS. 5, 6 and 7 are views showing plane structures of driving transistors of R, G, and B unit pixels in a flat panel display in accordance with another embodiment of the present invention, respectively.
Figure 6:
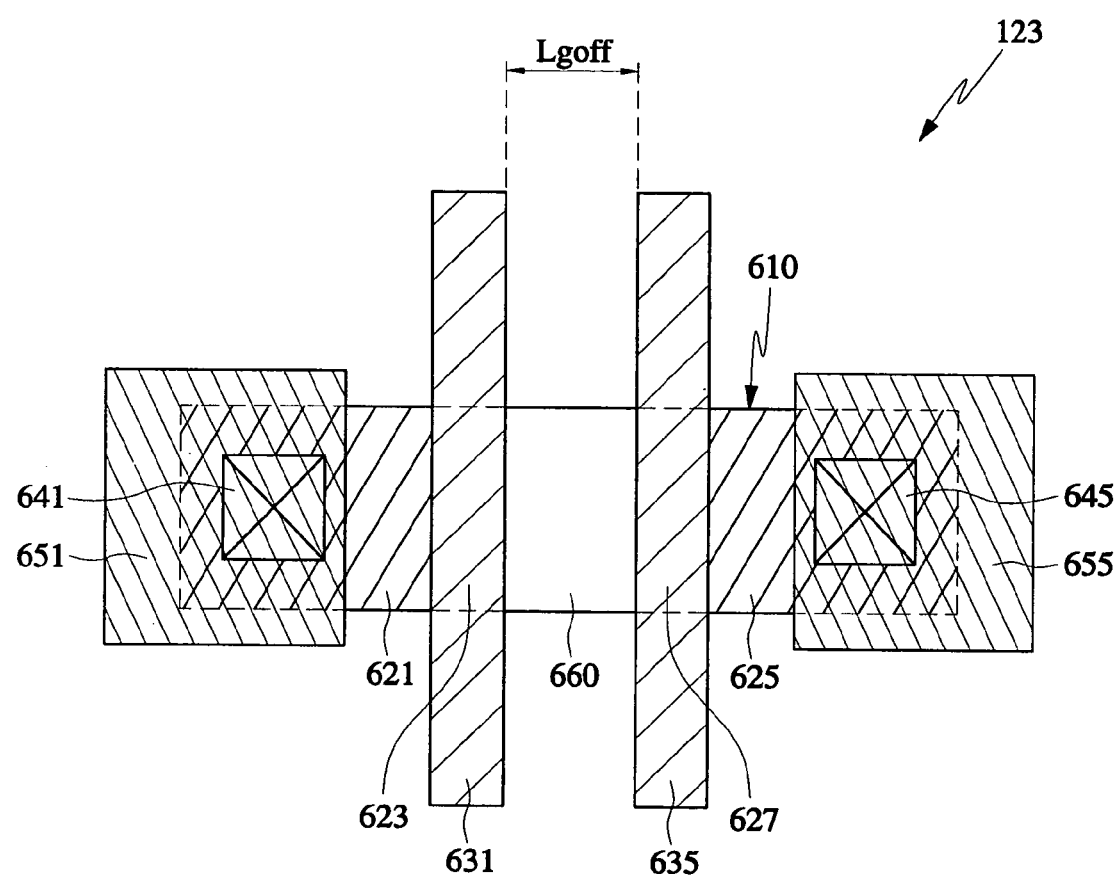
Figure 7:
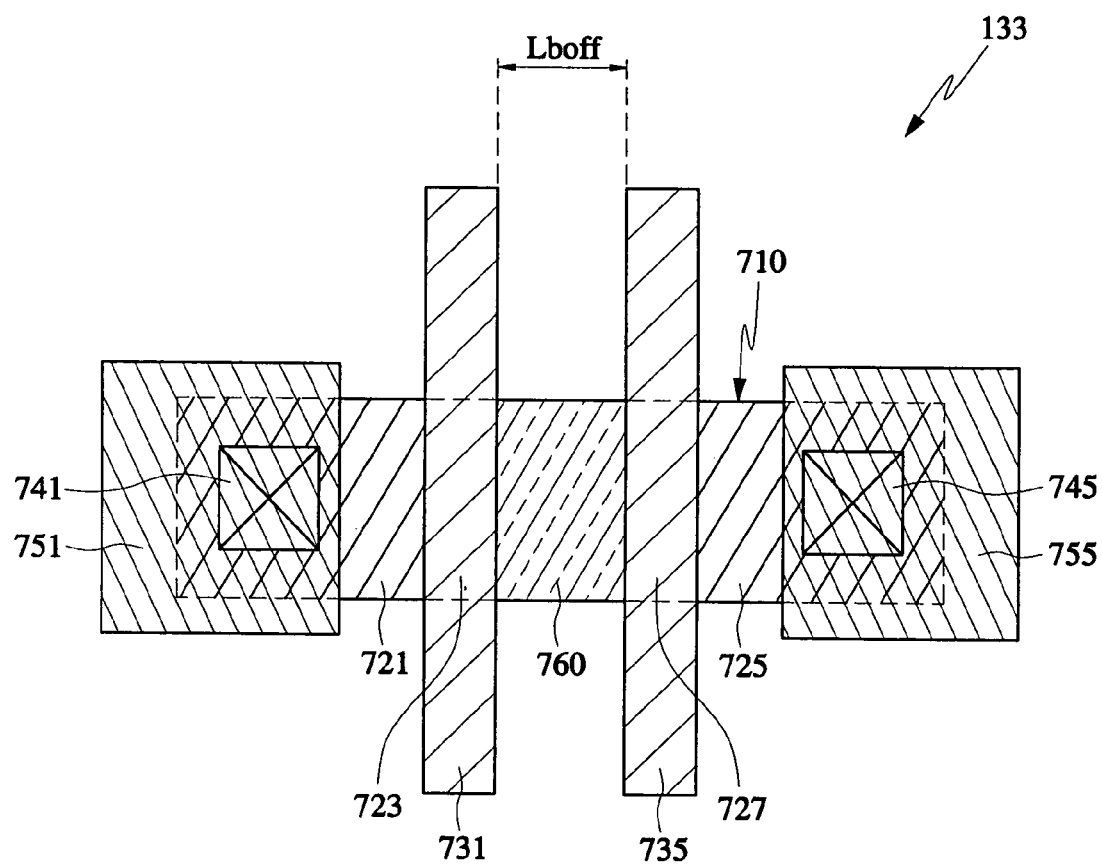

FIGS. 5 to 7 show plane structures of an organic light emitting diode in accordance with the embodiments of the present invention, wherein driving transistors of the R, G, and B unit pixels are limited to be shown.

Referring to FIG. 5, a driving transistor 113 of an R unit pixel includes a semiconductor layer 510, gate electrodes 531 and 535, and source/drain electrodes 551 and 555. The semiconductor layer 510 includes multi channel layers 523 and 527 formed at portions corresponding to multi gates 531 and 535, and high concentration source/drain regions 521 and 525 formed at the sides of the multi channel layers 523 and 527. The high concentration source/drain regions 521 and 525 are electrically connected to source/drain electrodes 551 and 555 through contacts 541 and 545, respectively.

In addition, the semiconductor layer 510 further includes an offset region 560 formed between the multi gates 531 and 535, i.e., between the multi channel layers 523 and 527. The offset region 560 has the same conductivity type as the high concentration source/drain regions 521 and 525, and is a region having a relatively low impurity concentration.

Referring to FIG. 6, a driving transistor 123 of a G unit pixel includes a semiconductor layer 610, multi gates 631 and 635, and source/drain electrodes 651 and 655. The semiconductor layer 610 includes multi channel layers 623 and 627 formed at portions corresponding to the multi gates 631 and 635, and high concentration source/drain regions 621 and 625 formed at the sides of the multi channel layers 623 and 627. The high concentration source/drain regions 621 and 625 are electrically connected to the source/drain electrodes 651 and 655 through contacts 641 and 645, respectively.

The semiconductor layer 610 further includes an offset region 660 formed between the multi gates 631 and 635, i.e., between the multi channel layers 623 and 627. The offset region 660 is an intrinsic region not doped with impurities. Thus, in the G unit pixel having the highest luminous efficiency, the offset region 660 between the multi gates 631 and 635 has no impurities doped, so that it has a resistance value higher than that of the offset region 560 of the R unit pixel doped with a relatively low impurity concentration.

Referring to FIG. 7, a driving transistor 133 of a B unit pixel includes a semiconductor layer 710, multi gates 731 and 735, and source/drain electrodes 751 and 755. The semiconductor layer 710 includes multi channel layers 723 and 727 formed at portions corresponding to the multi gates 731 and 735, and high concentration source/drain regions 721 and 725 formed at one sides of the multi channel layers 723 and 727. The high concentration source/drain regions 721 and 725 are electrically connected to the source/drain electrodes 751 and 755 through contacts 741 and 745, respectively.

In addition, the semiconductor layer 710 further includes an offset region 760 formed between the multi gates 731 and 735, i.e., between the multi channel layers 723 and 727. In this case, the offset region 760 of the B unit pixel has the same conductivity type as the source/drain regions 721 and 725, and is a region doped with an impurity concentration higher than the offset region 560 of the R unit pixel. Thus, the offset region 760 between the multi gates 731 and 735 of the B unit pixel having the lowest luminous efficiency is doped with a high concentration of impurities, so that the offset region 760 has the lowest resistance value among the R, G, and B unit pixels.

According to another embodiments of the present invention, channel layers of driving transistors of R, G, and B unit pixels having different luminous efficiencies with one another are formed with the same sizes, and lengths $L_{roff}$, $L_{goff}$, and $L_{boff}$ of offset regions between multi gates of the driving transistors of the unit pixels are formed with the same values. These offset regions are formed to have different resistance values with one another, thereby achieving the white balance.

That is, the offset region 660 of the G unit pixel having the highest luminous efficiency is not doped with impurities so that the offset region 660 has a high resistance value. Meanwhile, the offset region 760 of the B unit pixel having the lowest luminous efficiency is doped with a high concentration of impurities so that it is formed to have a low resistance value. The offset region 560 of the R unit pixel having luminous efficiency between those of the G unit pixel and the B unit pixel is doped with a low concentration of impurities so that it is formed to have a resistance value between those of the G unit pixel and the B unit pixel.

While the multi gate is shown to consist of two gates in another embodiment of the present invention, it is possible for driving transistors of the R, G, and B unit pixels to have different resistance values from one another regardless of the structures of the multi gates and the number of gates. In addition, while the offset region of the G unit pixel is shown not to be doped with impurities, and the offset regions of the R and B unit pixels are shown to be doped with high and low concentrations of impurities, respectively, it is also possible for the offset regions of the driving transistors of the R, G, and B unit pixels to be doped at different doping concentrations from one another in order to have different resistance values to embody the white balance.

According to the embodiments of the present invention as mentioned above, by adjusting resistance values of the offset regions between the multi gates of the R, G, and B unit pixels or adjusting geometric structures of the offset regions, the white balance can be embodied without increasing pixel areas which are occupied in the R, G and B unit pixels having the driving transistors.

While the present invention has been described with reference to a particular embodiment, it is understood that the disclosure has been made for purpose of illustrating the invention by way of examples and is not limited to limit the scope of the invention. And one skilled in the art can amend and change the present invention without departing from the scope and spirit of the invention.

What is claimed is:

1. A flat panel display, comprising:
a plurality of pixels, where each of the plurality of pixels includes R, G and B unit pixels to embody red (R), green (G) and blue (B) colors, respectively, and where each of the unit pixels includes a transistor with multi gates,
wherein transistors of at least two unit pixels of the R, G, and B unit pixels each include an offset region between the multi gates, and wherein the offset regions of the at least two unit pixels have different geometric structures.

2. The flat panel display according to claim 1, wherein the R, G, and B unit pixels each further include a light-emitting device driven by the transistor, respectively, where a resistance value of an offset region of a transistor for driving a light-emitting device having the highest luminous efficiency among the transistors of the R, G, and B unit pixels is higher than a resistance value of offset regions of transistors for driving light-emitting devices having a relatively lower luminous efficiency.

3. The flat panel display according to claim 1, wherein total lengths of the offset regions between the multi gates of the transistors of the R, G, and B unit pixels are the same, and offset lengths of a portion in the offset regions, where the portion is not doped with impurities, are different.

4. The flat panel display according to claim 3, wherein the R, G, and B unit pixels each further include a light-emitting device driven by the transistor, respectively, where an offset length of an offset region of a transistor for driving a light-emitting device having the highest luminous efficiency among the transistors is longer than an offset length of an offset region of transistors for driving light-emitting devices having a relatively lower luminous efficiency.

5. The flat panel display according to claim 1, wherein total lengths of the offset regions between the multi gates of the transistors of the R, G, and B unit pixels are the same, and the offset regions have different widths.

6. The flat panel display according to claim 5, wherein the R, G, and B unit pixels each further include a light-emitting device driven by the transistor, where an offset length of an offset region of a transistor for driving a light-emitting device having the highest luminous efficiency among the transistors is longer than an offset length of an offset region of transistors for driving light emitting devices having relatively lower luminous efficiency.

7. The flat panel display according to claim 1, wherein widths of the offset regions between the multi gates of the transistors of the R, G, and B unit pixels are the same, and lengths of the offset regions are different.

8. The flat panel display according to claim 7, wherein the R, G, and B unit pixels each further include a light-emitting device driven by the transistor, where an offset length of an offset region of a transistor for driving a light-emitting device having the highest luminous efficiency among the transistors is longer than an offset length of an offset region of transistors for driving light-emitting devices having relatively lower luminous efficiency.

9. A flat panel display, comprising:
a plurality of pixels, where each of the plurality of pixels including R, G and B unit pixels to embody red (R), green (G) and blue (B) colors, respectively, and where each of the unit pixels includes a transistor with multi gates,
wherein transistors of at least two unit pixels of the R, G, and B unit pixels each include an offset region between the multi gates, and wherein the offset regions of the at least two unit pixels have different resistance values.

10. The flat panel display according to claim 9, wherein the unit pixels having different resistance values from one another each include light-emitting device, respectively, and the transistors for controlling currents supplied to the light-emitting device of each unit pixel have channel layers with the same size.

11. The flat panel display according to claim 9, wherein the R, G, and B unit pixels each include a light-emitting device driven by the transistor, respectively, and resistance values of offset regions of the transistors are determined by luminous efficiencies of the light-emitting devices driven by the transistors.

12. The flat panel display according to claim 11, wherein a resistance value of an offset region of a transistor for driving a light-emitting device having the highest luminous efficiency among the transistors of the R, G, and B unit pixels is higher than a resistance value of offset regions of transistors for driving light-emitting device having a relatively low luminous efficiency.

13. The flat panel display according to claim 9, wherein the offset regions of the transistors of the R, G, and B unit pixels have different doping concentrations.

14. The flat panel display according to claim 13, wherein the R, G, and B unit pixels each further include a light-emitting device driven by the transistor, respectively, and an offset region of a transistor for driving a light-emitting device having the highest luminous efficiency among the transistors is doped with impurities at a doping concentration lower than offset regions of transistors for driving light-emitting devices having a relatively lower luminous efficiency.

15. The flat panel display according to claim 9, wherein the offset regions of at least two transistors among the transistors of the R, G, and B unit pixels are doped with impurities having different doping concentrations.

16. The flat panel display according to claim 15, wherein the R, G, and B unit pixels each further include a light-emitting device driven by the transistor, respectively, and an offset region of a transistor for driving a light-emitting device having the high luminous efficiency of the at least two transistors is doped with impurities at doping concentration lower than that of the other transistor.

* * * * *